United States Patent [19]

Sumner

[11] 4,201,623

[45] May 6, 1980

[54] METHOD FOR MAKING EPITAXIAL SILICON CRYSTALS WITH UNIFORM DOPING LEVELS

[75] Inventor: Barbara E. Sumner, Washington, D.C.

[73] Assignee: The United States of America as represented by the Secretary of the Army, Washington, D.C.

[21] Appl. No.: 900,206

[22] Filed: May 23, 1978

[51] Int. Cl.² .................... B01J 17/20; B01J 17/24; H01L 21/62

[52] U.S. Cl. .................... 156/622; 156/624; 156/DIG. 64; 156/DIG. 83; 148/171

[58] Field of Search ............... 156/600, 605, 622, 624, 156/DIG. 64, DIG. 83; 422/248, 254; 148/171; 23/300

[56] References Cited

U.S. PATENT DOCUMENTS

| | | | |
|---|---|---|---|
| 3,480,535 | 11/1969 | Bloom | 148/171 |
| 3,565,702 | 2/1971 | Nelson | 156/605 |
| 4,012,233 | 3/1977 | Mayer et al. | 148/171 |
| 4,047,986 | 9/1977 | Hanoka | 148/171 |
| 4,058,418 | 11/1977 | Lindmayer | 148/171 |
| 4,128,440 | 12/1978 | Baliga | 148/171 |

*Primary Examiner*—Bradley R. Garris
*Attorney, Agent, or Firm*—Nathan Edelberg; Robert P. Gibson; Aubrey J. Dunn

[57] ABSTRACT

A crystal substrate of <111> silicon is doped by being exposed to a liquid metal solvent. The substrate is carried in a cavity in a refractory boat, and the solvent is carried in a perforation of a cover for the boat. The boat is heated to a certain temperature in a non-oxidizing atmosphere and is moved to place the substrate cavity under the cover perforation whereby the solvent and substrate come in contact. The temperature is raised and held to allow the desired substrate-solvent solution to form, then is reduced and held to allow supersaturation and eventually precipitation of the doped substrate. The boat is next moved to remove the cavity from beneath the perforation, is allowed to cool to room ambient, and is removed from the non-oxidizing atmosphere. The doped substrate is then cleaned as desired to remove any attached solvent.

3 Claims, 2 Drawing Figures

METHOD FOR MAKING EPITAXIAL SILICON CRYSTALS WITH UNIFORM DOPING LEVELS

The invention described herein may be manufactured, used, and licensed by the U.S. Government for governmental purposes without the payment of any royalties thereon.

BACKGROUND OF THE INVENTION

The invention is in the field of extrinsic photoconductors having responses in the infrared spectrum. In particular, 3 to 5 and 8 to 14 microns are of interest to the military, and single-crystal silicon seed material is a specific material often used. Such photoconductors have heretofore been produced by various doping methods, such as vacuum evaporation, sublimation, electrodeposition, chemical vapor deposition, molecular beam deposition or sputtering. Those methods, because of various problems, are usually unable to produce high-quality single crystal growth with low compensation and high uniformity that extrinsic detector material must have. Some of the problems are:

(1) initiation of growth is severely hampered by residual oxygen or oxide formation in the growth system and/or in the silicon seed material,
(2) control and reproducibility of layer growth is poor,
(3) heavy doping levels are difficult to obtain,
(4) the expenses of obtaining and maintaining high purity seed material are great.

My invention avoids all of these four problems.

SUMMARY OF THE INVENTION

The invention is a method of making epitaxial silicon crystals using a liquid metal solvent. A silicon substrate is carried in a cavity in a refractory boat and the solvent is carried in a perforation in a cover for the boat. The boat is heated in a non-oxidizing atmosphere and is moved relative to the cover to allow the solvent to come in contact with and dissolve a certain amount of the substrate. The temperature is raised to some maximum point for desired liquid solubility, the solution is allowed to equilibrate, then the temperature is lowered to allow percipitation of the doped silicon. The boat is next moved to remove the substrate from beneath the solvent and the temperature is allowed to drop to room ambient. Finally, the boat is removed from the nonoxidizing atmosphere, and the substrate is removed and cleaned as desired.

DETAILED DESCRIPTION OF THE INVENTION

Figure 1:
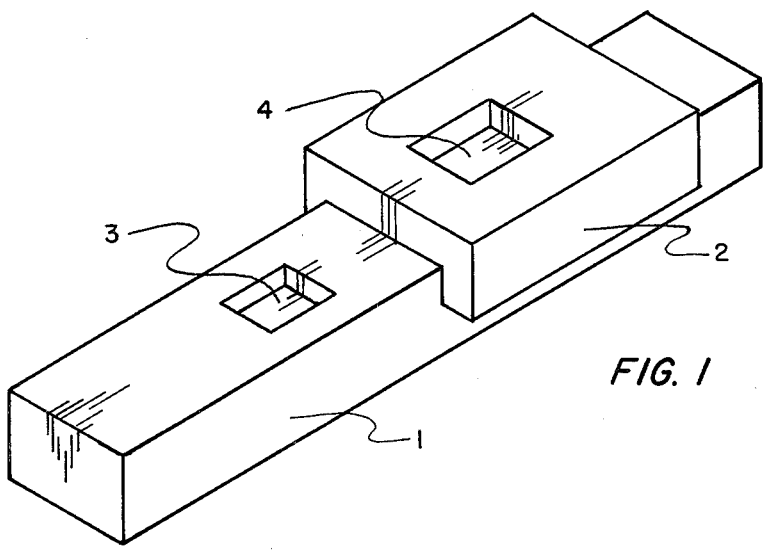
FIG. 1 shows a pictorial view of a refractory boat/cover combination with which the invention may be performed.

The invention may perhaps be best understood by referring to the drawings, in which FIG. 1 shows boat 1 and cover 2. The boat has cavity 3 therein and the cover has perforation 4 therethrough. In use, a silicon substrate (chip) is loaded into cavity 3 and a metal solvent is loaded into perforation 4.

Figure 2:
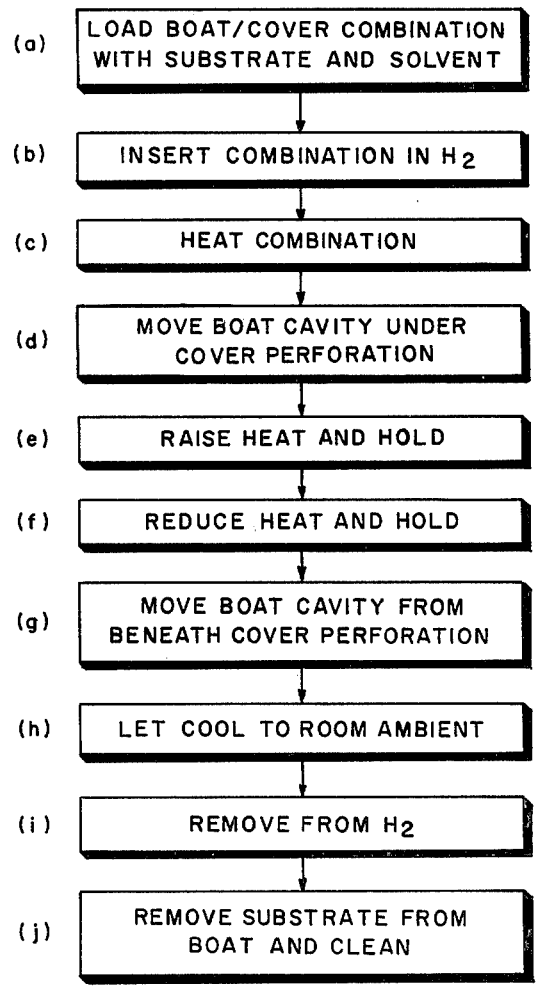
FIG. 2 shows a flow chart of the steps of the invention.

The steps of my method are shown in the flow chart of FIG. 2 but it should be understood that some of the steps may be combined. The process starts with (a) wherein a <111> silicon substrate or chip is loaded in the cavity of the boat, the cover is placed on the boat, and the metal solvent is placed in the perforation in the cover. In step (b) the assembled and loaded boat/cover combination is inserted into a quartz tube and; the tube is then sealed, evacuated, and a flow of hydrogen is begun through the tube. In step (c) a roll-on type of resistance furnace is moved to surround and heat the boat in the tube. When a certain temperature is reached, the boat is moved with respect to the cover to bring the chip in contact with the solvent, as stated for step (d). The furnace temperature is then raised, step (e), to a sufficient temperature and for a sufficient time to allow saturation of the chip with the solvent. In step (f) the temperature is reduced in a controlled manner to allow precipitation of solid doped material on the chip. The boat is again moved in step (g), this time to remove the chip from beneath the solvent. In step (h) the furnace is removed and the boat is allowed to cool to room ambient. Finally, the hydrogen flow is stopped, the boat is removed from the tube, and the chip is removed from the boat and cleaned as steps (i) and (j) recite.

Particular examples of metal solvents which may be used in the invention are aluminum, gallium, indium and tellurium, although other metals or mixed alloys with low melting points may be used. Moreover, germanium rather than silicon may be used as a substrate. The chip, after growth, may be washed in acid or other appropriate cleaner to remove any residual doping solvent on the chip surface.

Typical examples of times and temperatures of the steps of the method are as follows, wherein a single crystal chip of silicon is the substrate and indium is the solvent. The temperature in step (c) will be approximately 300° C. (sufficient to melt the indium). In step (e) the temperature is raised to 900°–1000° C. at 12° C./min. and is held for 4–5 hours. The temperature is then reduced in step (f) to approximately 700° C. at 0.4° C./min. and is held for 2–3 hours at this temperature. In step (h) the furnace is removed and the boat cools to the ambient temperature inside the quartz tube (about room temperature) at an uncontrolled and unassisted rate.

In the case of gallium, the temperature of step (c) need be only about 35° C. The temperature is raised in step (e) to 600° C. at 12° C./min. and held for 3–4 hours. In step (f) the heat is reduced to 300° C. at 0.8°/min. and held at 300° C. for 2–3 hours. Steps (g) and (h) are then performed as described above.

The boat as used in the inventive method must be made of a material which does not contaminate the materials of the method, which has good thermal and mechanical shock properties, is non-porous, and is capable of being formed or machined. The preferred material is high-purity graphite, although various refractory oxides such as alumina, zirconia, and thoria or carbides and nitrides such as $B_4C$, $BN_3$, $Si_2N_3$ or some glasses may be used.

The various temperatures specified above may be determined by a thermo-couple or equivalent buried in the boat, with its connecting wires coming out of the quartz tube.

I claim:

1. A method of making, in a refractory boat, an epitaxial silicon crystal layer on a silicon substrate, wherein said boat includes a base portion with a substrate cavity therein and a cover portion atop said base portion with a perforation therethrough, including the steps of:

loading said cavity with a first material consisting of said substrate;
loading said perforation with a second material consisting of a metal solvent;
placing said boat in a non-oxidizing atmosphere;
heating said boat to a first temperature;
relatively moving said base and said cover portions with respect to each other to place said cavity under said perforation whereby said solvent contacts said substrate;
raising said temperature at a controlled rate to a second temperature and holding for a first time whereby said substrate and said solvent diffuse into each other to form a saturated solution;
reducing said temperature at a controlled rate to a third temperature and holding for a second time whereby said solvent first reaches an equilibrium solution, then supersaturation, then precipitation;
relatively moving said base and said cover portions with respect to each other to remove said cavity from beneath said perforation.

cooling said boat to ambient; and
removing said boat from said non-oxidizing atmosphere, removing the substrate from said boat, and cleaning said substrate to remove any metal solvent on the surface thereof.

2. The method as set forth in claim 1 wherein, in the case of <111> silicon and with indium as the metal solvent, said first temperature is approximately 300° C., said second temperature is approximately 950° C. and is raised thereto at 12° C. per minute, said first time is approximately 3.5 hours, said third temperature is approximately 700° C. and is reduced thereto at 0.4° C. per minute, and said second time is approximately 2.5 hours.

3. The method as set forth in claim 1 wherein, in the case of <111> silicon and with gallium as the metal solvent, said first temperature is approximately 35° C., said second temperature is approximately 600° C. and is raised thereto at 12° C. per minute, said fist time is approximately 3.5 hours, said third temperature is approximately 300° C. and is reduced thereto at 0.8° C. per minute, and said second time is approximately 2.5 hours.

* * * * *